US011231326B2

(12) United States Patent
Maegawa

(10) Patent No.: US 11,231,326 B2
(45) Date of Patent: Jan. 25, 2022

(54) INFRARED IMAGING ELEMENT, INFRARED IMAGING ARRAY, AND METHOD FOR MANUFACTURING INFRARED IMAGING ELEMENT

(71) Applicant: MITSUBISHI ELECTRIC CORPORATION, Chiyoda-ku (JP)

(72) Inventor: Tomohiro Maegawa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 284 days.

(21) Appl. No.: 16/603,103

(22) PCT Filed: Jan. 29, 2018

(86) PCT No.: PCT/JP2018/002640
§ 371 (c)(1),
(2) Date: Oct. 4, 2019

(87) PCT Pub. No.: WO2018/216265
PCT Pub. Date: Nov. 29, 2018

(65) Prior Publication Data
US 2020/0271527 A1   Aug. 27, 2020

(30) Foreign Application Priority Data

May 22, 2017   (JP) .............................. JP2017-100723

(51) Int. Cl.
*G01J 5/20* (2006.01)
*H01L 27/146* (2006.01)
(Continued)

(52) U.S. Cl.
CPC ................. *G01J 5/20* (2013.01); *G01J 5/024* (2013.01); *H01L 27/1465* (2013.01);
(Continued)

(58) Field of Classification Search
CPC ...... G01J 5/20; G01J 5/024; G01J 2005/0077; G01J 2005/202; G01J 5/0225; G01J 1/02;
(Continued)

(56) References Cited

U.S. PATENT DOCUMENTS

| 5,627,112 A | 5/1997 | Tennant et al. |
| 6,034,374 A | 3/2000 | Kimura et al. |

(Continued)

FOREIGN PATENT DOCUMENTS

| JP | 9-210769 A | 8/1997 |
| JP | 10-185681 A | 7/1998 |

(Continued)

OTHER PUBLICATIONS

International Search Report dated Apr. 10, 2018 in PCT/JP2018/002640 filed Jan. 29, 2018.

(Continued)

*Primary Examiner* — Seung C Sohn
(74) *Attorney, Agent, or Firm* — Xsensus LLP

(57) ABSTRACT

This infrared imaging element includes: a substrate which has a front surface and a back surface and to which a circuit unit is provided; a support leg wiring line that is disposed above the front surface of the substrate; and an infrared-ray detection unit which is held on the support leg wiring line and to which a diode electrically connected to the circuit unit via the support leg wiring line is provided, wherein the temperature change of the infrared-ray detection unit is detected as an electrical signal change of the diode by the circuit unit. The substrate, the support leg wiring line, and the infrared-ray detection unit are laminated at intervals in a direction perpendicular to the front surface of the substrate.

8 Claims, 14 Drawing Sheets

(51) Int. Cl.
*G01J 5/02* (2006.01)
*G01J 5/00* (2006.01)

(52) U.S. Cl.
CPC .... *H01L 27/1469* (2013.01); *H01L 27/14634* (2013.01); *H01L 27/14636* (2013.01); *H01L 27/14689* (2013.01); *G01J 2005/0077* (2013.01); *G01J 2005/202* (2013.01)

(58) Field of Classification Search
CPC ......... H01L 27/14634; H01L 27/14636; H01L 27/1465; H01L 27/14689; H01L 27/1469; H01L 27/144; H01L 27/146; H04N 5/33
See application file for complete search history.

(56) References Cited

U.S. PATENT DOCUMENTS

| | | | |
|---|---|---|---|
| 6,094,127 A | 7/2000 | Yong | |
| 7,442,599 B2* | 10/2008 | Maa | B82Y 20/00 438/199 |
| 8,980,671 B2* | 3/2015 | Hongo | H01L 27/14634 438/57 |
| 2006/0054823 A1 | 3/2006 | Yon et al. | |
| 2009/0152467 A1 | 6/2009 | Cheon et al. | |
| 2016/0153837 A1 | 6/2016 | Kakimoto et al. | |

FOREIGN PATENT DOCUMENTS

| | | |
|---|---|---|
| JP | 11-211558 A | 8/1999 |
| JP | 2002-531860 A | 9/2002 |
| JP | 2006-86535 A | 3/2006 |
| WO | WO 00/34751 A1 | 6/2000 |
| WO | WO 2014/199583 A1 | 12/2014 |

OTHER PUBLICATIONS

Ishikawa, T. et al., "Low-cost 320 × 240 uncooled IRFPA using conventional silicon IC process," Part of the SPIE Conference on infrared Technology and Applications XXV, vol. 3698, Apr. 1999, pp. 556-564.

* cited by examiner

INFRARED IMAGING ELEMENT, INFRARED IMAGING ARRAY, AND METHOD FOR MANUFACTURING INFRARED IMAGING ELEMENT

TECHNICAL FIELD

The present invention relates to a thermal infrared solid-state imaging element that converts incident infrared ray into heat and detects the heat, and more particularly to a thermal infrared solid-state imaging element that integrates an electrical signal from a semiconductor sensor by a signal processing circuit to output the electrical signal. The present invention also relates to a method for manufacturing an infrared imaging element.

BACKGROUND ART

In a general thermal infrared solid-state imaging element, pixels having a heat insulation structure are two-dimensionally arranged, and an infrared image is captured by using a change in temperature of the pixels due to incident infrared ray. In the case of a thermal infrared solid-state imaging element, for example, a semiconductor element such as a diode is used as a temperature sensor constituting a pixel. In the case of using a semiconductor element, the variation in the electric characteristics and the temperature dependence between elements is very small, so that the characteristic of each pixel can be made uniform.

In a thermal infrared solid-state imaging element using a diode as a temperature sensor, pixels are two-dimensionally arrayed, connected to drive lines for each row, and connected to signal lines for each column. The drive lines are selected in order by the vertical scanning circuit and the switch, and power is supplied from the power source to the pixels through the selected drive lines. The output of the pixel is transmitted to an integration circuit through a signal line, integrated and amplified by the integration circuit, and sequentially output to an output terminal by a horizontal scanning circuit and a switch (for example, see Non-Patent Document 1).

PRIOR ART DOCUMENT

Non-Patent Document

Non-Patent Document 1: Ishikawa et al., "Low cost 320×240 uncooled IRFPA using conventional silicon IC process", Part of the SPIE Conference on infrared Technology and Applications XXV, published in April 1999, Vol. 3698, p. 556 to 564

SUMMARY OF THE INVENTION

Problems to be Solved by the Invention

The conventional thermal infrared solid-state imaging element adopts a hollow heat insulation structure in which a temperature detection part including a temperature sensor such as a diode is held on a hollow portion by a supporting leg. Therefore, it is necessary to remove a substrate below the temperature detection part, and the temperature detection part, the supporting legs, and the wiring are arranged in the same plane, thus causing problems, such as 1) an area of the region where the temperature detection part, the supporting legs, and the wiring are arranged is limited, 2) a complicated correction circuit cannot be provided for each pixel, and 3) a chip area is increased because a readout circuit is formed outside a pixel array region.

Therefore, an object of the present invention is to provide an infrared imaging element and an infrared imaging array capable of solving the problems 1) to 3) and achieving high performance and miniaturization.

Means for Solving the Problems

The present invention is an infrared imaging element including: a substrate having a front surface and a back surface and provided with a circuit part; a supporting leg wiring disposed above the front surface of the substrate; and an infrared detection part held on the supporting leg wiring and provided with a diode electrically connected to the circuit part through the supporting leg wiring, the infrared imaging element detecting a temperature change of the infrared detection part as a change of an electrical signal of the diode by the circuit part, wherein the substrate, the supporting leg wiring, and the infrared detection part are stacked in a direction perpendicular to the front surface of the substrate at an interval therebetween.

The present invention is also an infrared imaging array in which the infrared imaging elements are arranged in an array.

Effects of the Invention

As described above, in the infrared imaging element according to the present invention, since a circuit region, a supporting leg region, and an infrared detection region can be stacked as different layers, the number of diodes is increased in the infrared detection region to increase detection sensitivity. In the supporting leg region, the supporting leg wiring can be lengthened to increase the thermal time constant. Therefore, it is possible to provide an infrared imaging element with high infrared detection sensitivity. In addition, a readout circuit and a correction circuit can be provided in the circuit region, and high performance and miniaturization can be achieved.

Further, in the infrared imaging array according to the present invention, the circuit region can be formed in the infrared imaging element constituting each pixel and need not be formed around the pixel array, and therefore, the infrared detection array can be miniaturized.

EMBODIMENTS OF THE INVENTION

First Embodiment

Figure 1:
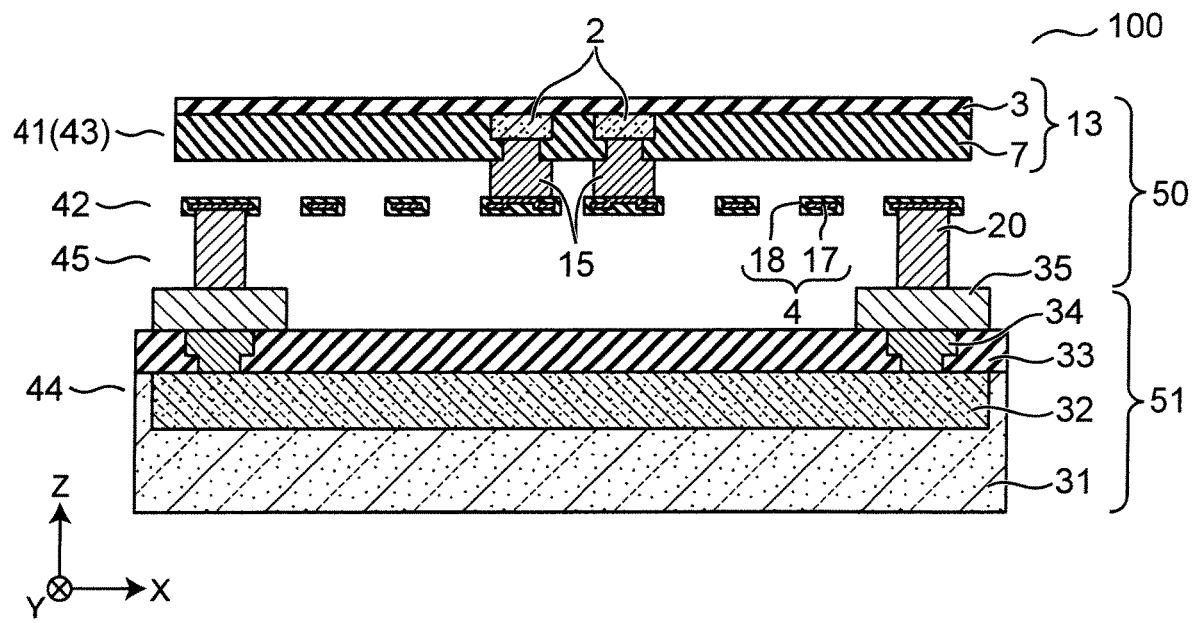
FIG. 1 is a cross-sectional view of an infrared imaging element according to a first embodiment of the present invention.
Figure 2:
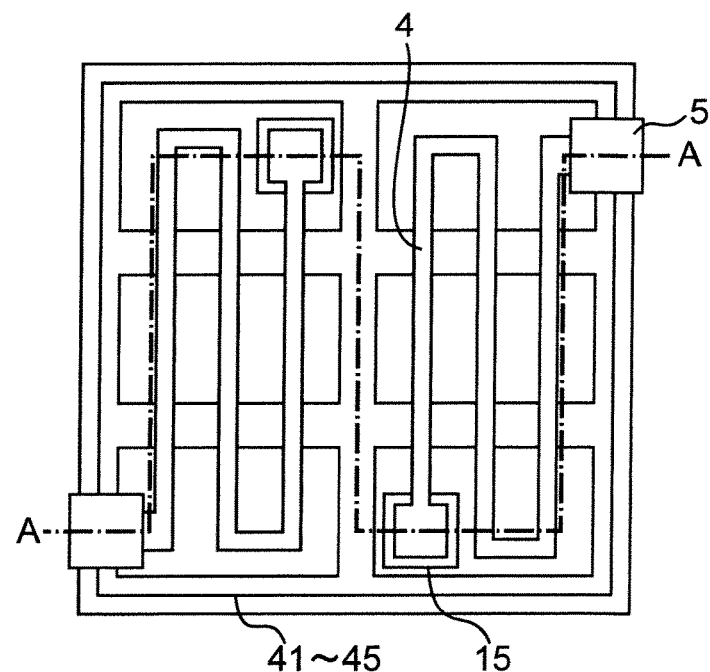
FIG. 2 is a schematic plan view of the infrared imaging element according to the first embodiment of the present invention.

FIG. 1 is a cross-sectional view of an infrared imaging element according to the first embodiment of the present invention, which is generally denoted by 100, and FIG. 2 is a schematic plan view of the infrared imaging element 100 of FIG. 1 when a first substrate 50 is viewed in a Z direction. Here, the cross-sectional view of FIG. 1 is a cross-sectional view taken along a broken line A-A of FIG. 2 in order to facilitate understanding. The infrared imaging element 100 corresponds to one pixel of an infrared imaging array.

The infrared imaging element 100 includes a substrate 31 having a front surface and a back surface and provided with a circuit part 32, a supporting leg wiring 4 disposed above the front surface of the substrate 31, and an infrared detection part 13 held on the supporting leg wiring 4 and provided with a diode 2 electrically connected to the circuit part 32 through the supporting leg wiring 4. A temperature change of the infrared detection part 13 is detected by the circuit part 32 as a change of the electrical signal of the diode 2. The substrate 31, the supporting leg wiring 4, and the infrared detection part 13 are stacked in a direction Z perpendicular to the front surface of the substrate 31 at an interval therebetween.

One end of the supporting leg wiring 4 is connected to a metal layer 20 provided on the front surface of the substrate 31, and the other end is connected to a metal wiring 15 provided in the infrared detection part 13.

More specifically, the infrared imaging element 100 includes a first substrate 50 and a second substrate 51. The second substrate 51 has the substrate 31 made of, for example, silicon. The circuit part 32 is provided on the substrate 31. The circuit part 32 includes, for example, an amplification circuit that amplifies an incident signal, and a correction circuit that performs analog and digital correction, and outputs the processed signal as an output signal. The top of the circuit part 32 is covered with an insulating film 33 made of, for example, silicon oxide. The insulating film 33 is provided with a wiring portion 34 electrically connected to the circuit part 32. On the insulating film 33, a metal layer 35 electrically connected to the wiring portion 34 is provided.

The metal layer 20 of the first substrate 50 is connected on the metal layer 35. On the metal layer 20, the supporting leg wiring 4 is provided. The supporting leg wiring 4 has a structure in which the periphery of a conductive film 17 of metal or the like is covered with an insulating film 18 of silicon oxide or the like. However, if the conductive film 17 is a material that does not deteriorate in an atmosphere such as oxygen and can sufficiently maintain strength, the entire conductive film 17 does not need to be covered with the insulating film 18 but, for example, only the upper surface or the lower surface may be covered.

The infrared imaging element 100 is provided with two supporting leg wirings 4, and one end of each supporting leg wiring 4 is electrically connected to the metal layer 20, and the other end is connected to the diode 2 of the infrared detection part 13 through the metal wiring 15. The diode 2 is provided in an insulating film 7 such as an oxide film or a nitride film, and a BOX oxide film 3 is formed thereon. Instead of the diode 2, an element whose electrical characteristics change due to temperature change may be used.

In the infrared imaging element 100, the diode 2, the insulating film 7, and the BOX oxide film 3 form an infrared detection region 41 (which also serves as an infrared absorption region 43). Further, the supporting leg wiring 4 forms a supporting leg region 42 for holding the infrared detection region 41 in the air. The circuit part 32 formed on the substrate 31 and connected to the diode 2 by the supporting leg wiring 4 forms a circuit region 44.

As can be seen from FIG. 1, in the infrared imaging element 100, the infrared detection region 41, the supporting leg region 42, and the circuit region 44 are formed in different planes and arranged to overlap with each other when viewed in a Z-axis direction of FIG. 1. Therefore, in the infrared imaging element 100 constituting one pixel, the formation region of the diode 2 can be expanded over the entire infrared detection region 41. Similarly, the supporting leg wiring 4 can be formed in the entire supporting leg region 42, and the circuit part 32 can be formed in the entire circuit region 44.

Here, in the infrared imaging element 100, the infrared ray incident from the Z-axis direction in FIG. 1 is absorbed by the BOX oxide film 3 and converted into thermal energy, whereby the temperature of the diode 2 provided in the insulating film 7 rises. The temperature rise in this case will be 1) proportional to the area of the XY plane of the infrared detection part 13 which is the light receiving area, and
2) inversely proportional to the ease of heat dissipation from the infrared detection part 13 (hereinafter referred to as "heat conductance").

Since the ease of heat dissipation from the infrared detection part 13 is substantially determined by the ease of heat dissipation from the supporting leg wiring 4, extending the supporting leg wiring 4 increases the heat conductance and increases the temperature rise. Further, the temperature rise can be similarly increased by enlarging the area of the infrared detection part 13.

The temperature rise of the infrared detection part 13 is detected as a change of the electrical signal of the diode 2. For example, when a plurality of diodes 2 are connected in series and operated at a constant current, the change in forward voltage of the diodes 2 with the temperature rise is proportional to the number of diodes 2. That is, the number of diodes 2 connected in series can be increased with the expansion of the infrared detection part 13, and as a result, the detection sensitivity can be improved. That is, expanding the infrared detection region 41 and the supporting leg region 42 makes it possible to improve the infrared detection sensitivity.

Figure 4:
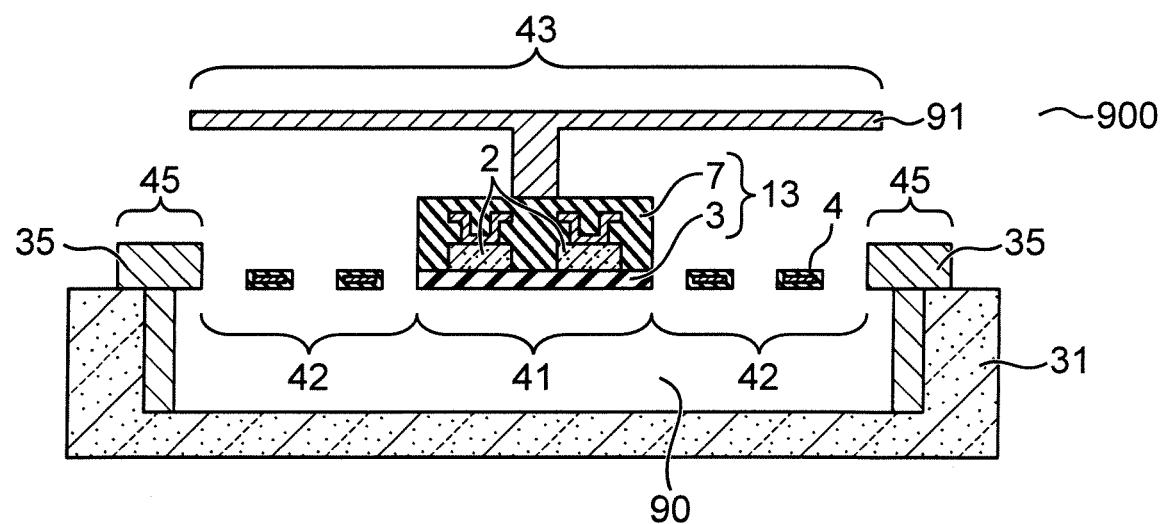
FIG. 4 is a cross-sectional view of a conventional infrared imaging element.
Figure 5:
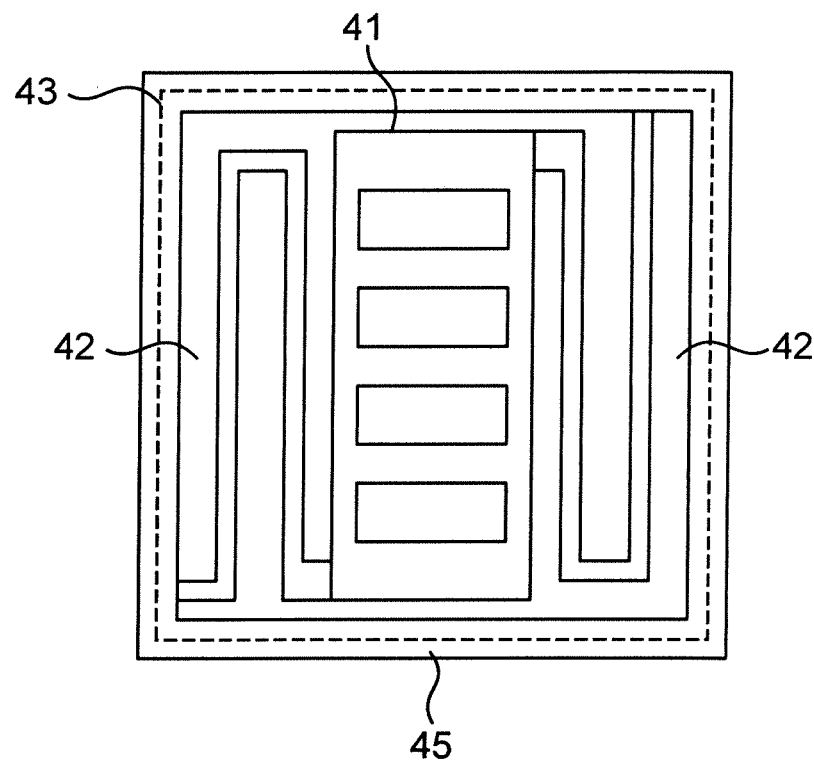
FIG. 5 is a schematic plan view of the conventional infrared imaging element.

On the other hand, FIG. 4 is a cross-sectional view of a conventional infrared imaging element generally denoted by 900, and FIG. 5 is a schematic plan view thereof. In FIG. 4, the same reference numerals as in FIG. 1 indicate the same or corresponding portions. In the infrared imaging element 900, a hollow portion 90 is formed on the substrate 31, the supporting leg wiring 4 is provided thereon, and the infrared detection part 13 is held. An umbrella structure 91 for light reception is provided on the infrared detection part 13.

As apparent from FIG. 4, in the conventional infrared imaging element 900, the infrared detection region 41, the supporting leg region 42, and a wiring region 45 are provided in the same plane. For this reason, the area of the region in which the diode, the supporting leg, and the wiring are arranged is limited, and the improvement of the detection sensitivity is limited.

On the other hand, as described above, in the infrared imaging element 100 according to the first embodiment of the present invention, the infrared detection region 41 and the supporting leg region 42 can be expanded to the entire width of one pixel, and the detection sensitivity can be improved and the size of the pixel can be reduced.

Figure 3:
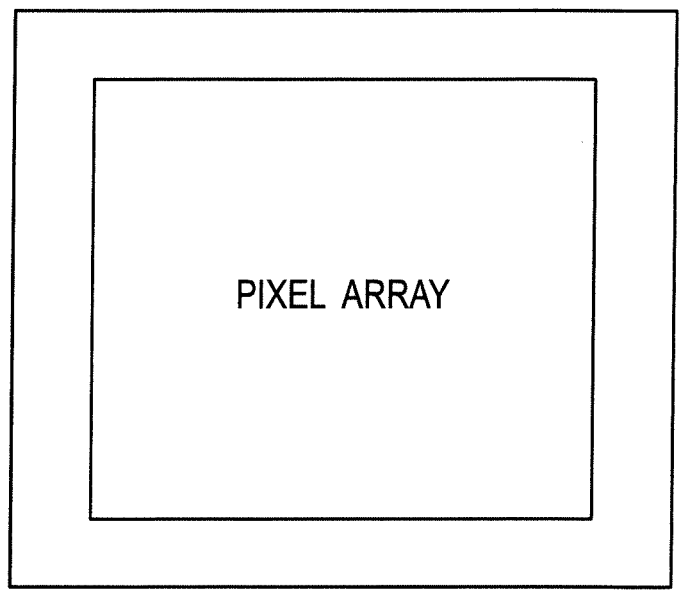
FIG. 3 is a configuration diagram of an infrared imaging array according to the first embodiment of the present invention.
Figure 6:
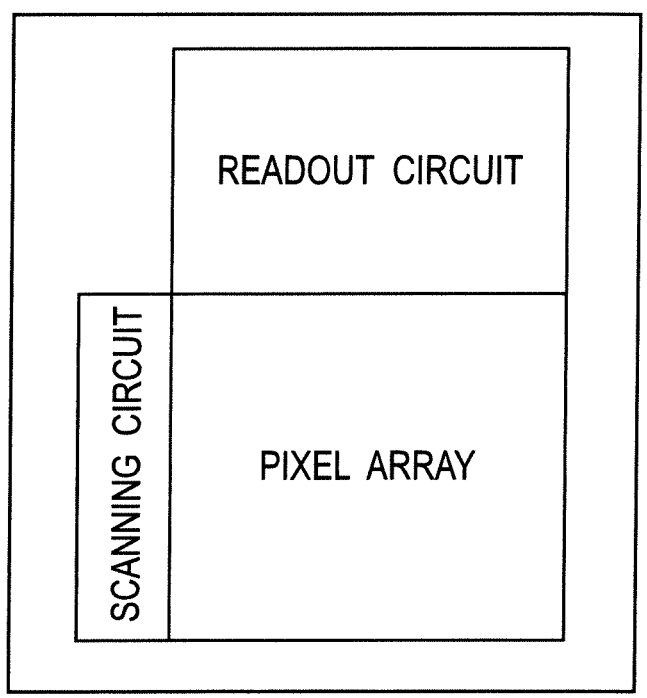
FIG. 6 is a configuration diagram of an infrared imaging array of the conventional infrared imaging element.

FIG. 3 is a configuration diagram of the infrared imaging array (chip) according to the first embodiment of the present invention, in which the infrared imaging elements 100 each constituting one pixel are arranged in an array. On the other hand, FIG. 6 is a configuration diagram of a conventional infrared imaging array (chip), in which the infrared imaging elements 900 each constituting one pixel are arranged in an array (pixel array), and a scanning circuit and a readout circuit are provided outside thereof.

That is, in the infrared imaging array according to the first embodiment of the present invention, the circuit region 44 is provided below the infrared detection region 41 and the supporting leg region 42, in other words, can be formed inside the infrared imaging element 100 constituting each pixel, and therefore it does not have to be formed around the pixel array. On the other hand, in the conventional infrared imaging element 900 having a hollow structure on the substrate 31, no circuit part can be provided in the substrate 31, and therefore, as shown in FIG. 6, a scanning circuit and a readout circuit are provided around each pixel.

Thus, in the infrared imaging array (chip) in which the infrared imaging elements 100 according to the first embodiment of the present invention are arranged in an array, there is no need to form a scanning circuit or readout circuit outside the pixel array region, and the chip area can be reduced.

Furthermore, in the infrared imaging element 100, a correction circuit can be provided in the circuit part 32 of each element, and correction can be performed by analog processing or digital processing for each pixel.

FIGS. 7a to 7d are circuit diagrams showing specific examples of the circuit part 32 provided on the second substrate 51 of the infrared imaging element 100. A portion surrounded by a broken line shows a diode formed on the first substrate 50.

Figure 7A:
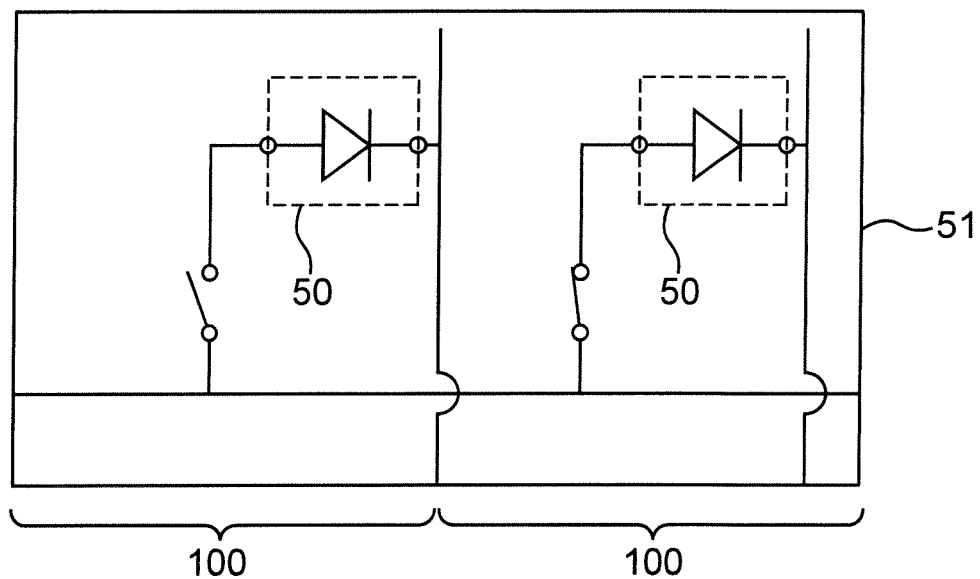
FIG. 7a is a circuit diagram of a circuit part according to the first embodiment of the present invention.

In the circuit of FIG. 7a, a switch is provided between the diode provided on the first substrate 50 and the wiring provided on the second substrate 51, whereby the operation time of the pixel can be controlled.

Figure 7B:
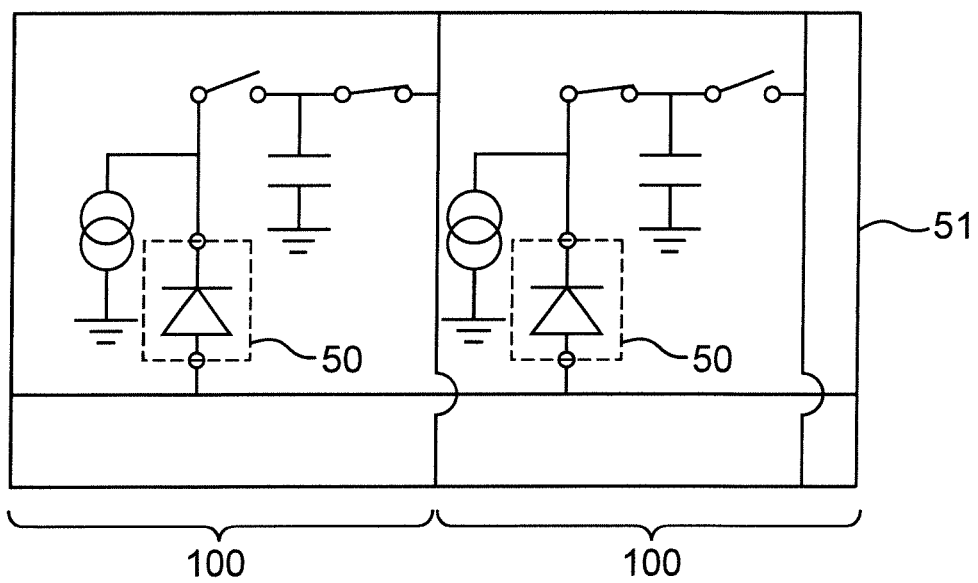
FIG. 7b is another circuit diagram of the circuit part according to the first embodiment of the present invention.

In the circuit of FIG. 7b, a current source and an integration circuit are provided for each pixel, whereby the circuit part 32 can be used as a readout circuit.

Figure 7C:
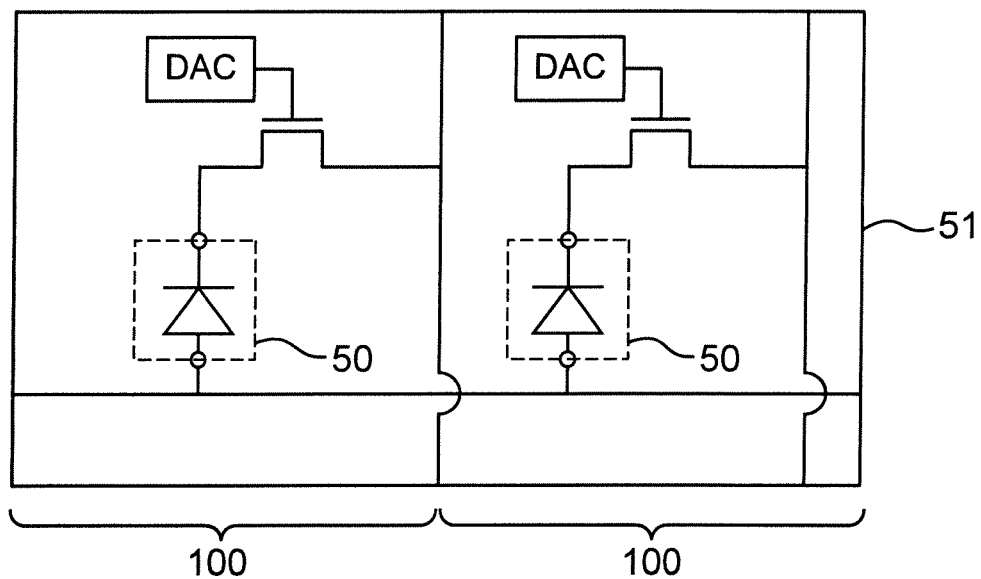
FIG. 7c is another circuit diagram of the circuit part according to the first embodiment of the present invention.

In the circuit of FIG. 7c, a digital-to-analog converter (DAC) is provided for each pixel, and the output level and the like can be corrected.

Figure 7D:
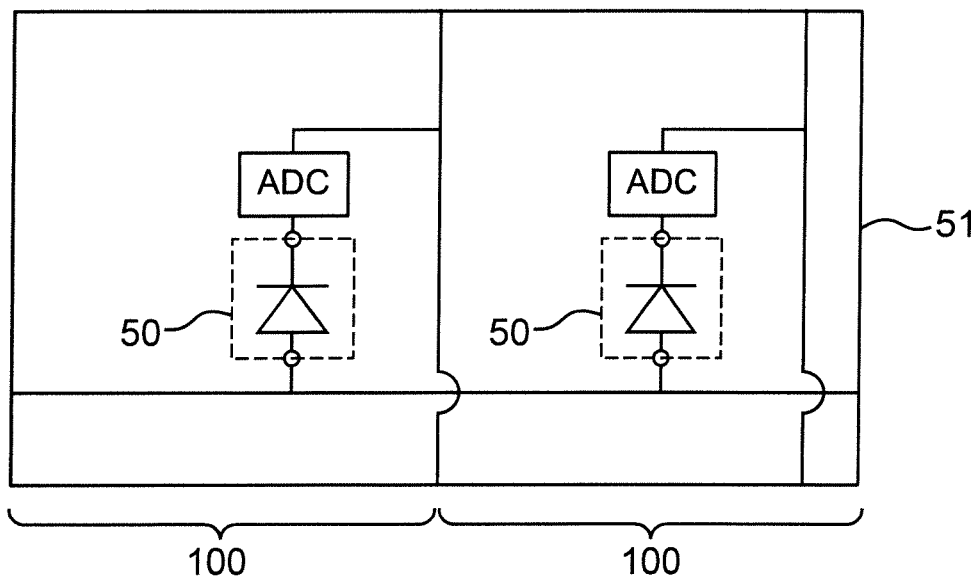
FIG. 7d is another circuit diagram of the circuit part according to the first embodiment of the present invention.

In the circuit of FIG. 7d, an analog-to-digital converter (ADC) is provided for each pixel, and the output level and the like can be corrected.

FIGS. 7a to 7d are examples of the circuit part 32, and for example, other circuits capable of correction such as noise reduction, gain adjustment, and output stabilization may be provided. In addition, a plurality of correction circuits may be combined.

Figure 8A:
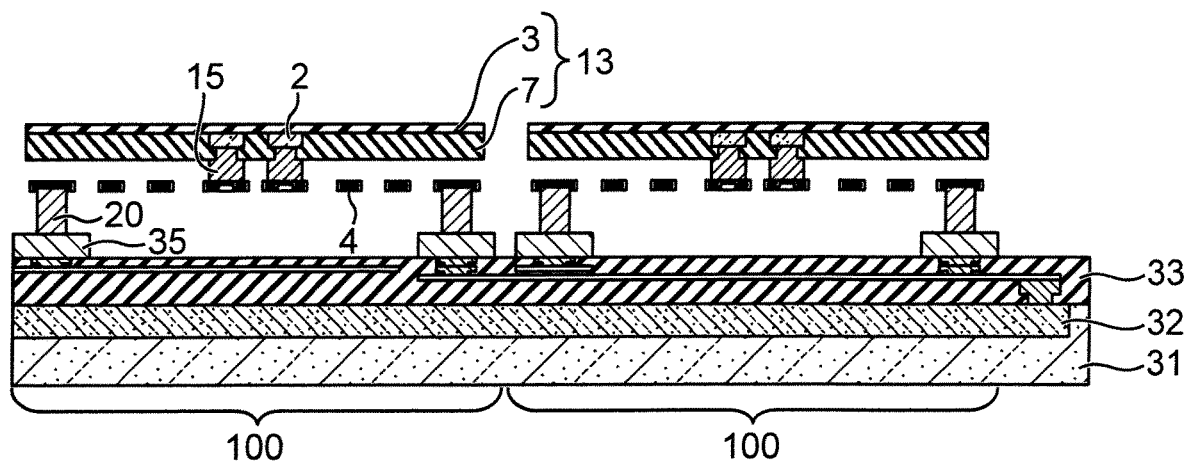
FIG. 8a is a cross-sectional view showing the arrangement of the circuit part of the infrared imaging array according to the first embodiment of the present invention.
Figure 8B:
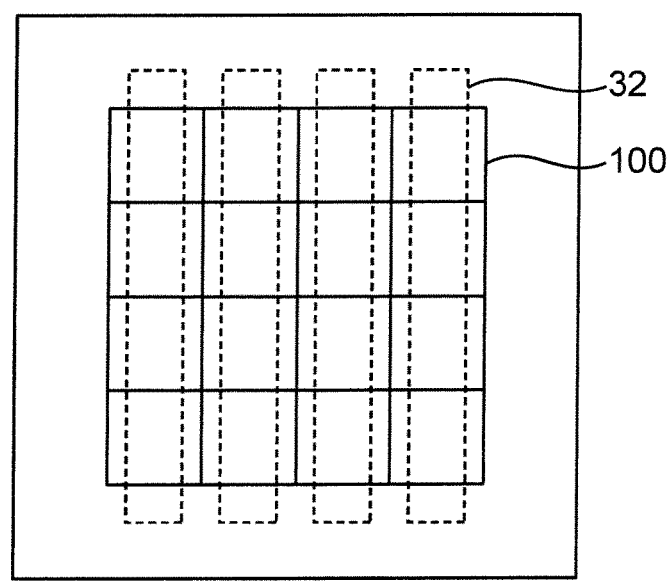
FIG. 8b is a plan view showing the arrangement of the circuit part of the infrared imaging array according to the first embodiment of the present invention.

FIG. 8a is a cross-sectional view showing the arrangement of the circuit part 32 of the infrared imaging array according to the first embodiment of the present invention in which the infrared imaging elements 100 are arranged in an array, and FIG. 8b is a plan view showing the arrangement of the circuit parts. In FIGS. 8a and 8b, the same reference numerals as in FIG. 1 indicate the same or corresponding portions. In FIG. 8a, the circuit part 32 is provided across the adjacent infrared imaging elements 100, and the circuit part 32 common to a plurality of infrared imaging elements 100 is provided. For example, when it is not necessary to perform complicated correction for each pixel, it is not necessary to provide the circuit part 32 for each infrared imaging element 100 (for each pixel), and, as shown in FIG. 8b, the circuit part 32 may be shared by four vertical pixels.

Figure 9A:
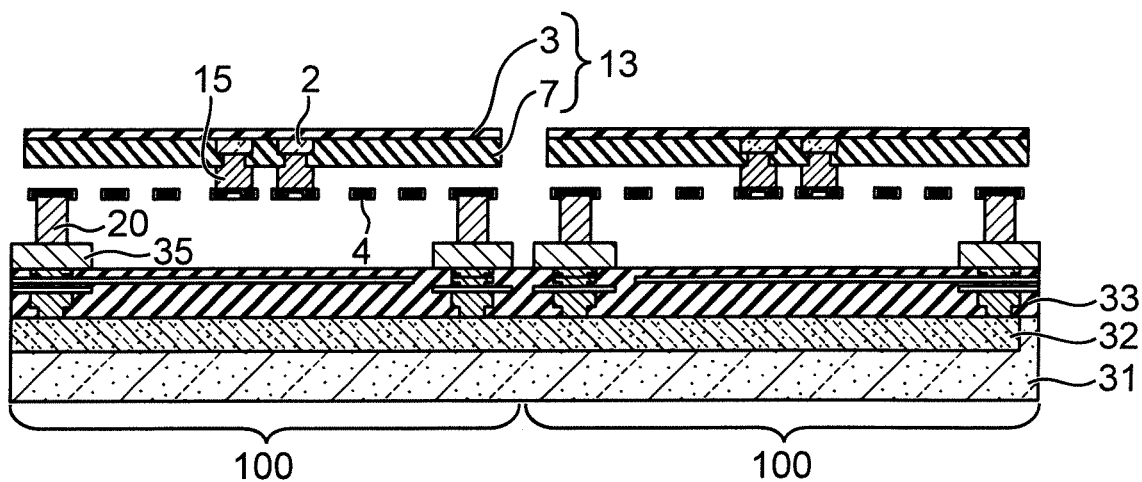
FIG. 9a is a cross-sectional view showing another arrangement of the circuit part of the infrared imaging array according to the first embodiment of the present invention.
Figure 9B:
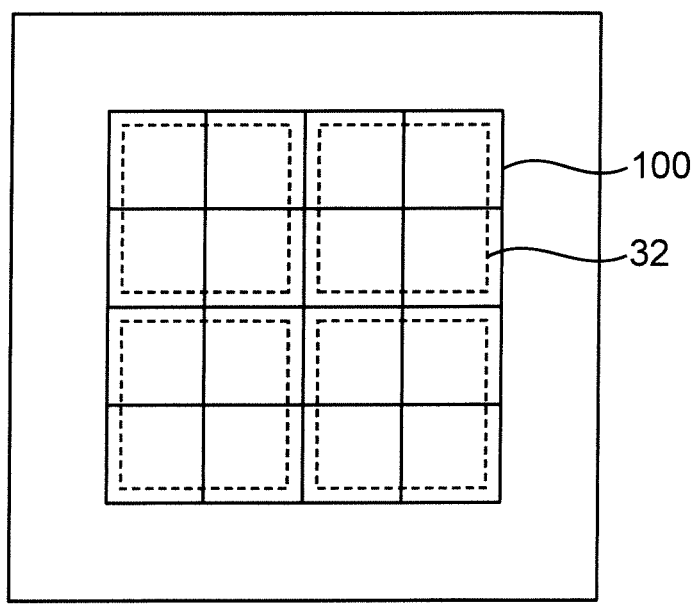
FIG. 9b is a plan view showing another arrangement of the circuit part of the infrared imaging array according to the first embodiment of the present invention.

FIG. 9a is a cross-sectional view showing another arrangement of the circuit part of the infrared imaging array according to the first embodiment of the present invention, and FIG. 9b is a plan view showing another arrangement of the circuit part. In FIGS. 9a and 9b, the same reference numerals as in FIG. 1 indicate the same or corresponding portions. In the structures of FIGS. 9a and 9b, the circuit part 32 common to the vertical and horizontal 2×2 infrared imaging elements 100 is provided.

Next, a method for manufacturing the infrared imaging element 100 according to the first embodiment of the present invention will be described with reference to FIGS. 10a to 10i. The method for manufacturing the infrared imaging element 100 includes the following steps 1 to 9.

Figure 10A:
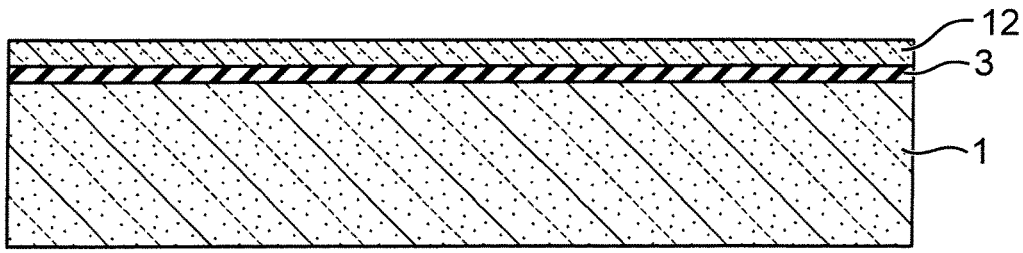
FIG. 10a is a cross-sectional view of a manufacturing process of the infrared imaging element according to the first embodiment of the present invention.

Step 1: As shown in FIG. 10a, in order to fabricate the first substrate 50, first, the substrate 1 supporting the pixels is prepared. The BOX oxide film 3 and a silicon layer 12 are formed on the substrate 1, and the whole is an SOI substrate.

Figure 10B:
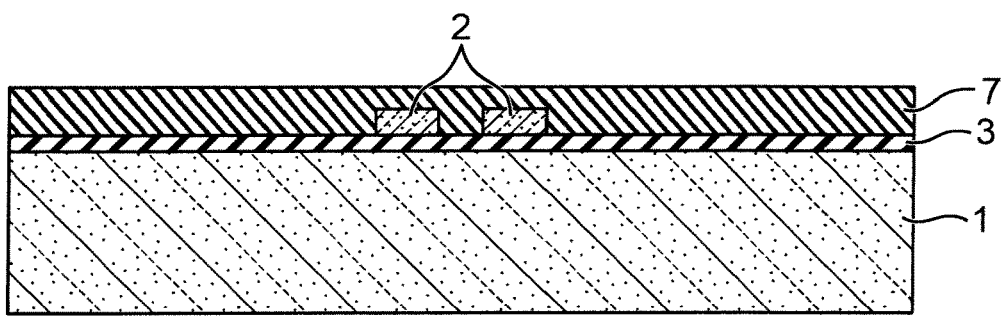
FIG. 10b is a cross-sectional view of the manufacturing process of the infrared imaging element according to the first embodiment of the present invention.

Step 2: As shown in FIG. 10b, the silicon layer 12 is processed to form two diodes 2 for temperature detection. The diode 2 has a p-type region and an n-type region, and the two diodes are connected in series by wiring (not shown). The processing of the silicon layer 12 is performed using wet etching or dry etching. Next, an insulating film 7 made of silicon oxide, silicon nitride or the like is formed so as to cover the diodes 2 to insulate between the diodes 2. The p-type region and the n-type region of the diode 2 are formed, for example, by thermal diffusion. The insulation between the diodes 2 may be performed by thermally oxidizing the silicon layer 12.

Figure 10C:
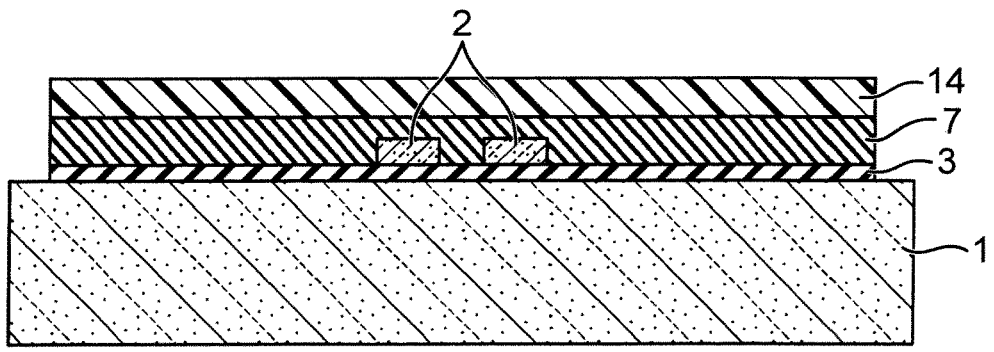
FIG. 10c is a cross-sectional view of the manufacturing process of the infrared imaging element according to the first embodiment of the present invention.

Step 3: As shown in FIG. 10c, a photoresist layer 14 is formed, and the BOX oxide film 3 and the insulating film 7 are patterned.

Figure 10D:
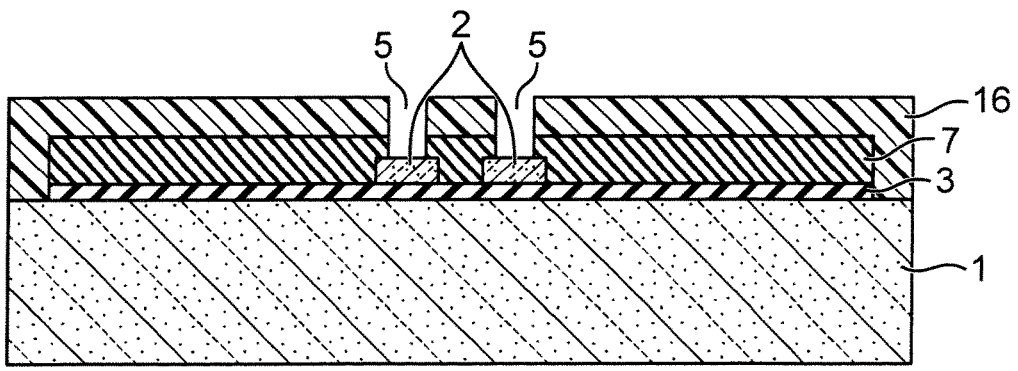
FIG. 10d is a cross-sectional view of the manufacturing process of the infrared imaging element according to the first embodiment of the present invention.

Step 4: As shown in FIG. 10d, a photoresist layer 16 is further formed, and using this as a mask, the insulating film 7 is opened to form contact holes 5 on the diodes 2, respectively.

Figure 10E:
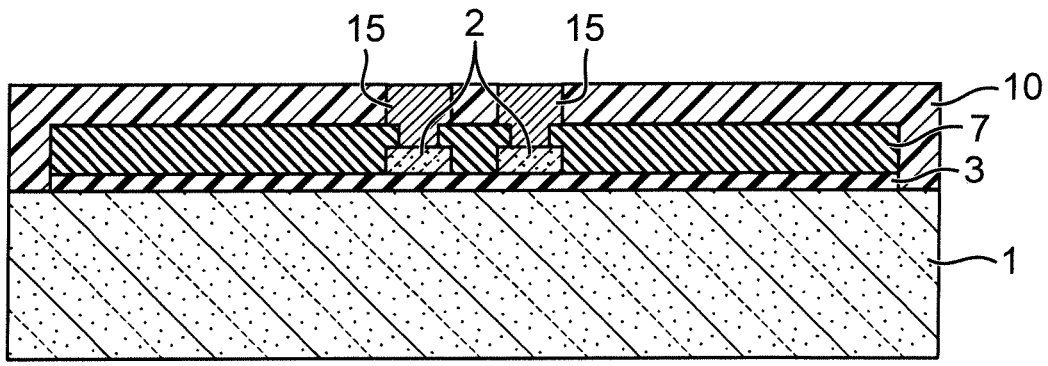
FIG. 10e is a cross-sectional view of the manufacturing process of the infrared imaging element according to the first embodiment of the present invention.

Step 5: As shown in FIG. 10e, the metal wirings 15 are embedded in the contact holes 5. A lift-off method using the photoresist layer 16 may be used to form the metal wirings 15. Next, after removal of the photoresist layer 16, a sacrificial layer 10 is formed. The sacrificial layer 10 is preferably a material different from the material used in the infrared detection region 41 and the supporting leg region 42, such as an organic material such as a resist material or an inorganic material such as polysilicon. The sacrificial layer 10 is formed, for example, by coating the entire surface of the substrate 1 and then being thinned by CMP or the like until the metal wirings 15 are exposed.

Figure 10F:
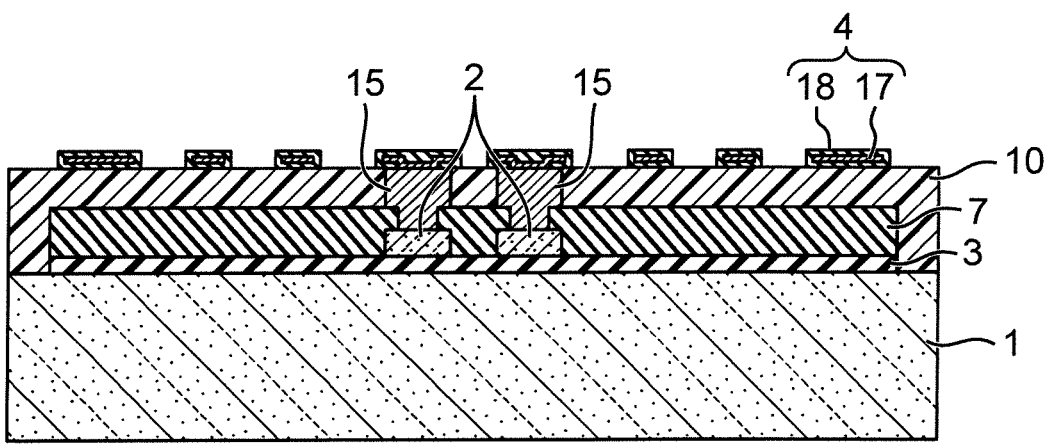
FIG. 10f is a cross-sectional view of the manufacturing process of the infrared imaging element according to the first embodiment of the present invention.

Step 6: As shown in FIG. 10f, the supporting leg wiring 4 is formed. The supporting leg wiring 4 has a structure in which the periphery of a conductive film 17 of metal or the like is covered with an insulating film 18 of silicon oxide or the like. However, if the conductive film 17 is a material that does not deteriorate in an atmosphere such as oxygen and can sufficiently maintain strength, the entire conductive film 17 does not need to be covered with the insulating film 18 but, for example, only the upper surface or the lower surface may be covered.

Figure 10G:
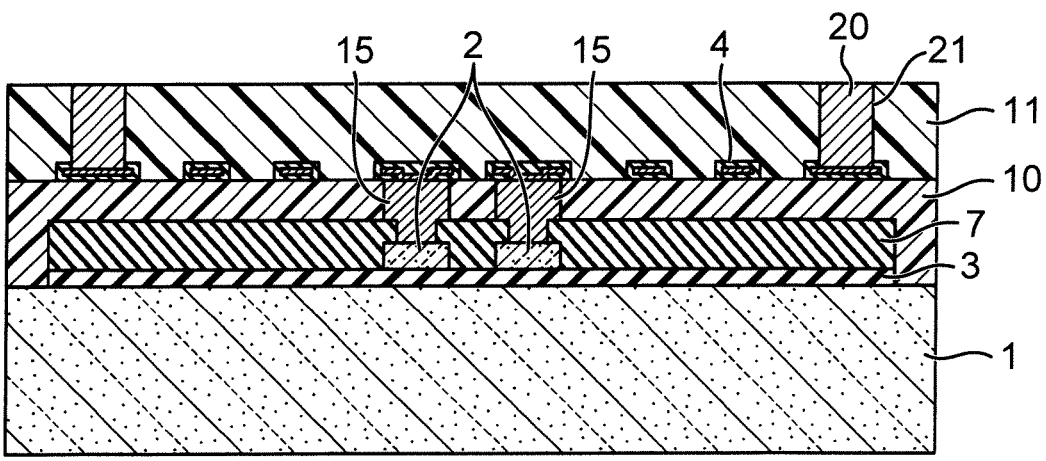
FIG. 10g is a cross-sectional view of the manufacturing process of the infrared imaging element according to the first embodiment of the present invention.

Step 7: As shown in FIG. 10g, after formation of a sacrificial layer 11 for forming the micro bump metal on the entire surface of the substrate 1, an opening 21 is formed in the sacrificial layer 11. At the bottom of the opening 21, the insulating film 18 is removed to expose the conductive film 17. Subsequently, using the conductive film 17 as a seed metal, the metal layer 20 is formed by plating. The metal layer 20 may have a laminated structure of an electrical connection layer such as Ni plating and a micro bump bonding layer such as solder plating in order to improve the electrical connection with the supporting leg wirings 4. In addition, the plated surface metal may be a material suitable for the micro bump bonding method with the second substrate 51 in the next step 8.

Figure 10H:
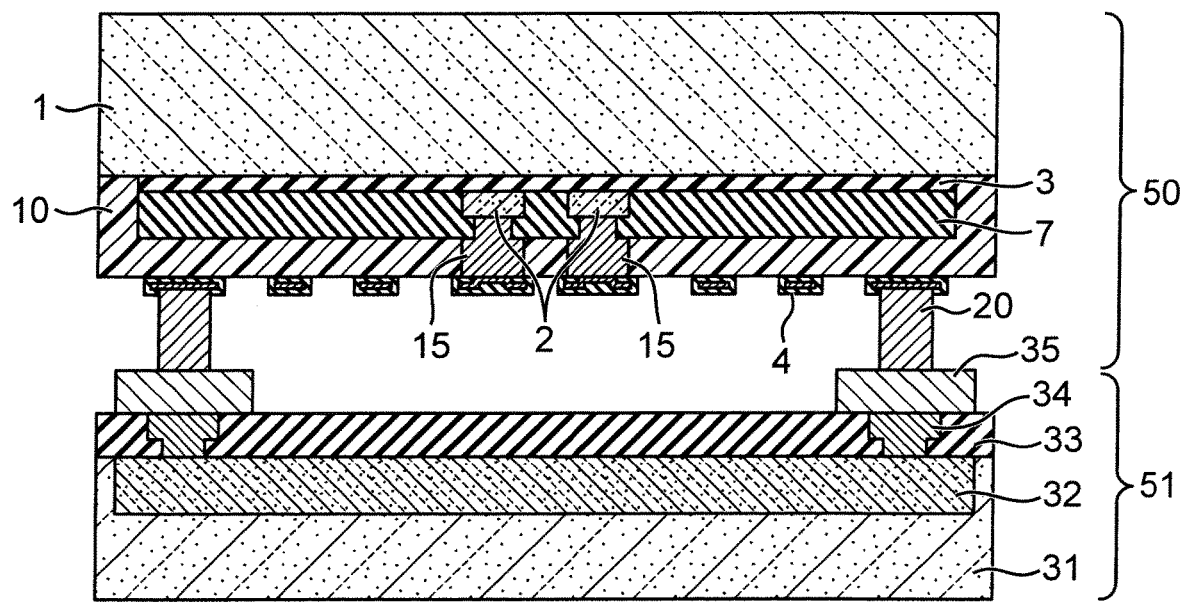
FIG. 10h is a cross-sectional view of the manufacturing process of the infrared imaging element according to the first embodiment of the present invention.

Step 8: As shown in FIG. 10h, the first substrate 50 formed in Steps 1 to 7 is connected to the second substrate 51. Here, in the second substrate 51, the circuit part 32 is formed on the substrate 31. An insulating film 33 such as silicon oxide is formed on the circuit part 32, and a wiring portion 34 electrically connected to the circuit part 32 is provided in the insulating film 33 and connected to the metal layer 35. The first substrate 50 and the second substrate 51 are attached so that the metal layer 20 of the first substrate 50 and the metal layer 35 of the second substrate 51 are electrically connected such that the upper surfaces thereof face each other. Next, the sacrificial layer 11 is removed. By removal of the sacrificial layer 11, a hollow structure is formed between the first substrate 50 and the second substrate 51. Note that, the sacrificial layer 11 may be removed in advance.

Figure 10I:
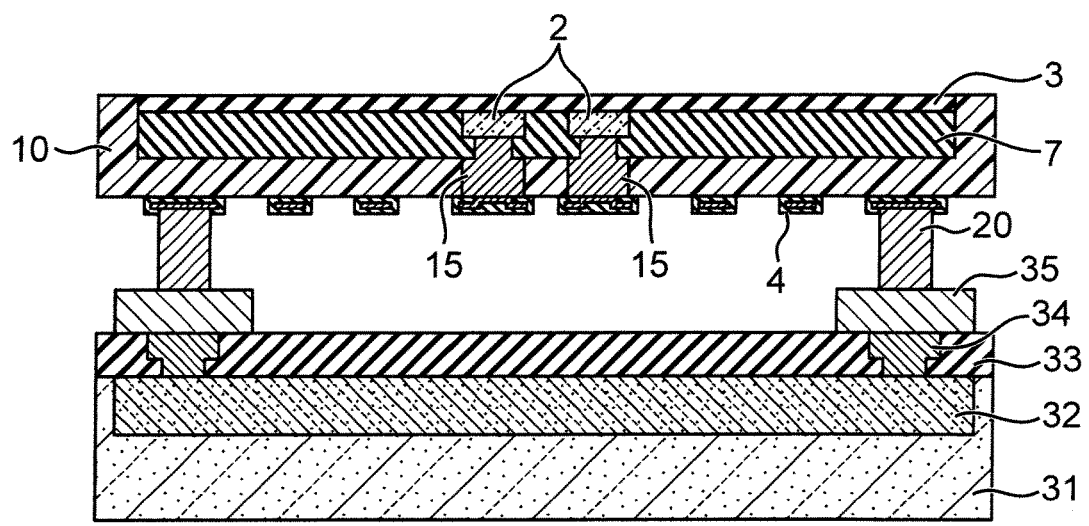
FIG. 10i is a cross-sectional view of the manufacturing process of the infrared imaging element according to the first embodiment of the present invention.

Step 9: As shown in FIG. 10i, the substrate 1 of the first substrate 50 is removed using grinding, CMP, wet or dry etching or the like. The removal process is performed until the BOX oxide film 3 and the sacrificial layer 10 are exposed. Finally, the sacrificial layer 10 is selectively removed. The sacrificial layer 10 can be selectively removed by using a material different from the material used for the infrared detection part 13 and the supporting leg wiring 4.

Through the above steps, the infrared imaging element 100 according to the first embodiment of the present invention as shown in FIG. 1 is completed.

Second Embodiment

Figure 11:
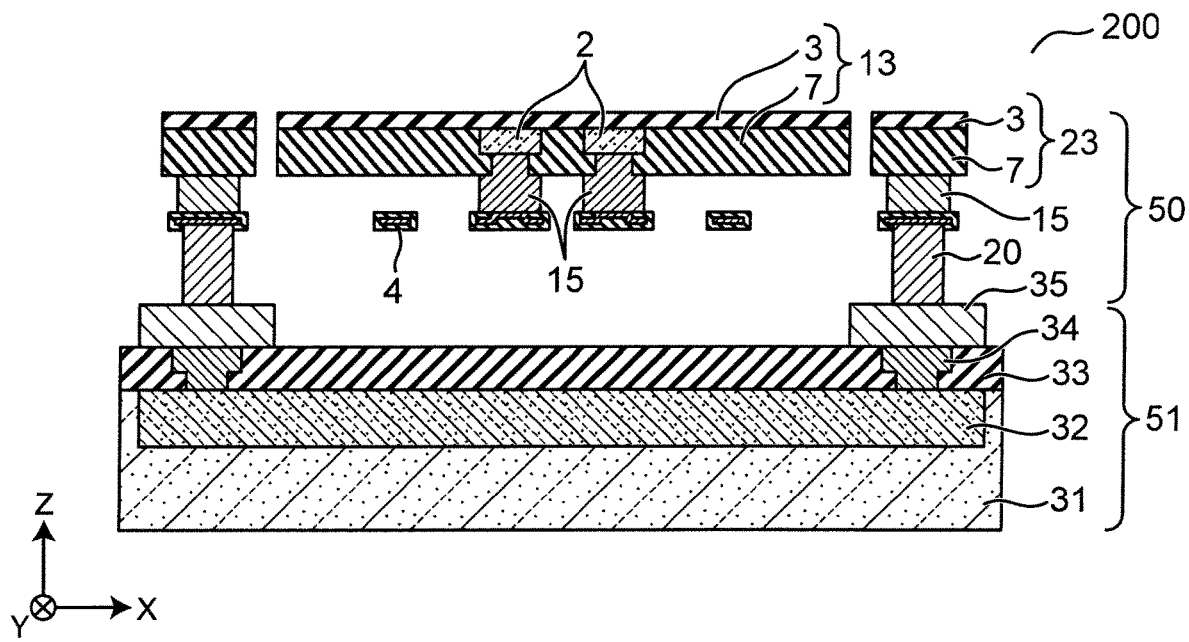
FIG. 11 is a cross-sectional view of an infrared imaging element according to a second embodiment of the present invention.
Figure 12:
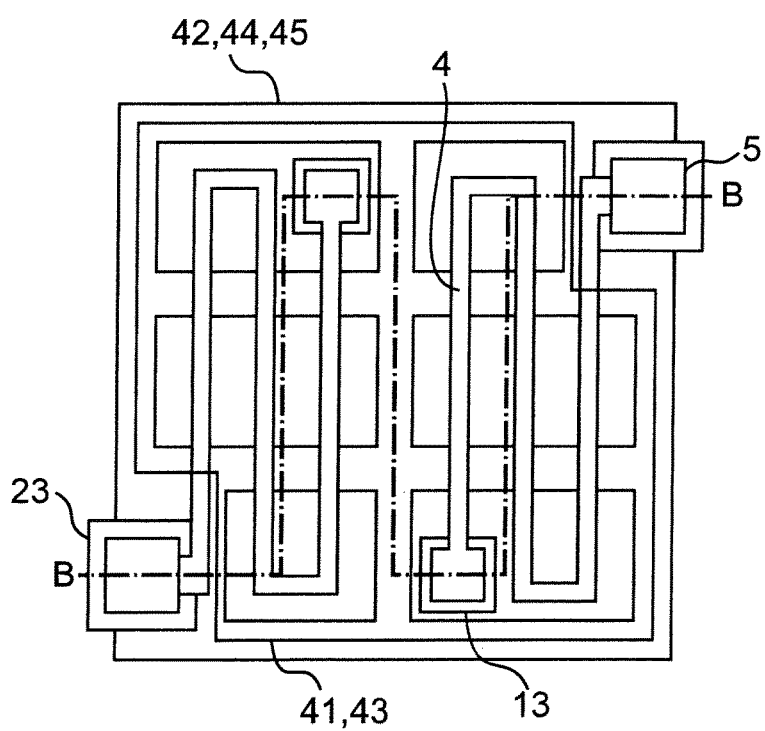
FIG. 12 is a schematic plan view of the infrared imaging element according to the second embodiment of the present invention.

FIG. 11 is a cross-sectional view of an infrared imaging element according to the second embodiment of the present invention, which is generally denoted by 200. FIG. 12 is a schematic plan view of the infrared imaging element 200 of FIG. 11 when the first substrate 50 thereof is viewed in the Z direction. Here, the cross-sectional view of FIG. 11 is a cross-sectional view taken along a broken line B-B of FIG. 12 to facilitate understanding. In FIGS. 11 and 12, the same reference numerals as in FIGS. 1 and 2 indicate the same or corresponding portions.

In the infrared imaging element 200, the metal wiring is also provided immediately above the supporting leg wiring 4 connected to the metal layer 20, and a micro bump bonding strength reinforcing beam 23 formed by separating a portion of the infrared detection part 13 is provided thereon.

That is, in the infrared imaging element 200, in the first substrate 50, one end of the supporting leg wiring 4 is connected, by the metal wiring 15, also to the micro bump bonding strength reinforcing beam 23 formed of the BOX oxide film 3 and the insulating film 7 as in the infrared detection part 13.

Figure 13:
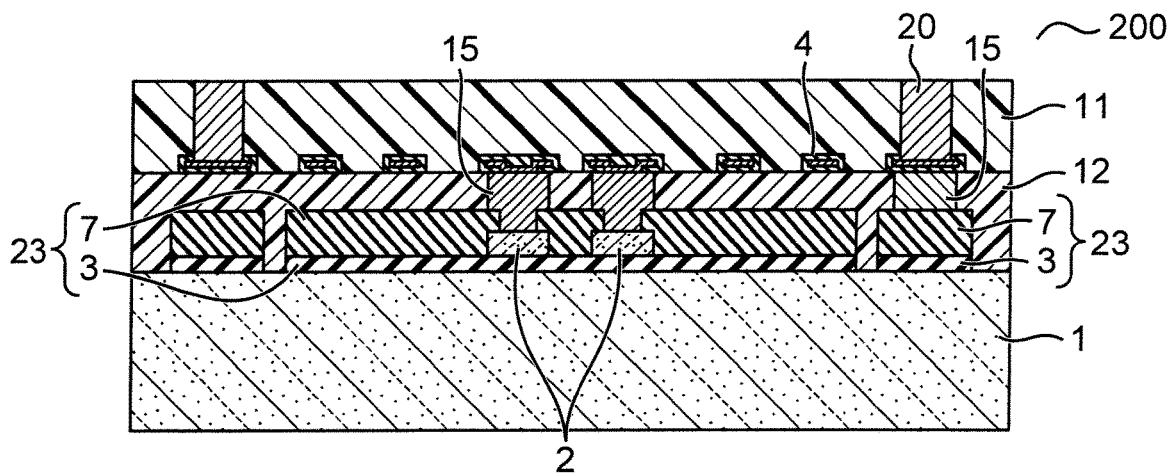
FIG. 13 is a cross-sectional view of a manufacturing process of the infrared imaging element according to the second embodiment of the present invention.

FIG. 13 is a cross-sectional view of a manufacturing process of the infrared imaging element 200 according to the second embodiment of the present invention, which corresponds to a manufacturing process 7 (FIG. 10g) of the infrared imaging element 100 according to the first embodiment. In this process, the micro bump bonding strength reinforcing beam 23 is processed so as to be separated from the infrared detection part 13.

In the infrared imaging element 200, since the micro bump bonding strength reinforcing beam 23 is supported on the second substrate 51 using the metal wiring 15 or the like, even if the sacrificial layer 10 is formed of an organic material or the like, in the step of bonding the first substrate 50 and the second substrate 51 (step 8 (FIG. 10h) in the first embodiment), the sacrificial layer 10 is not deformed or damaged by load, and the yield can be improved.

Third Embodiment

Figure 14A:
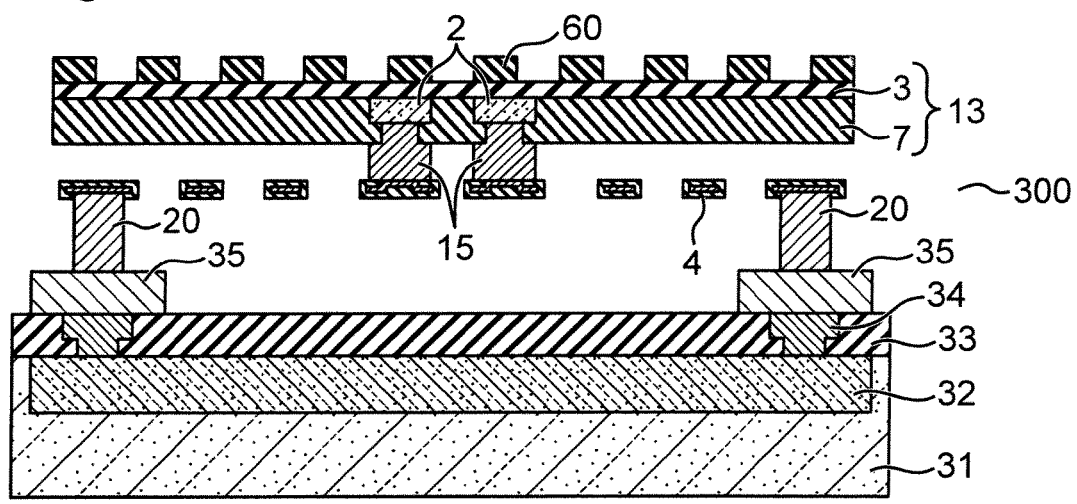
FIG. 14a is a cross-sectional view of an infrared imaging element according to a third embodiment of the present invention.
Figure 14B:
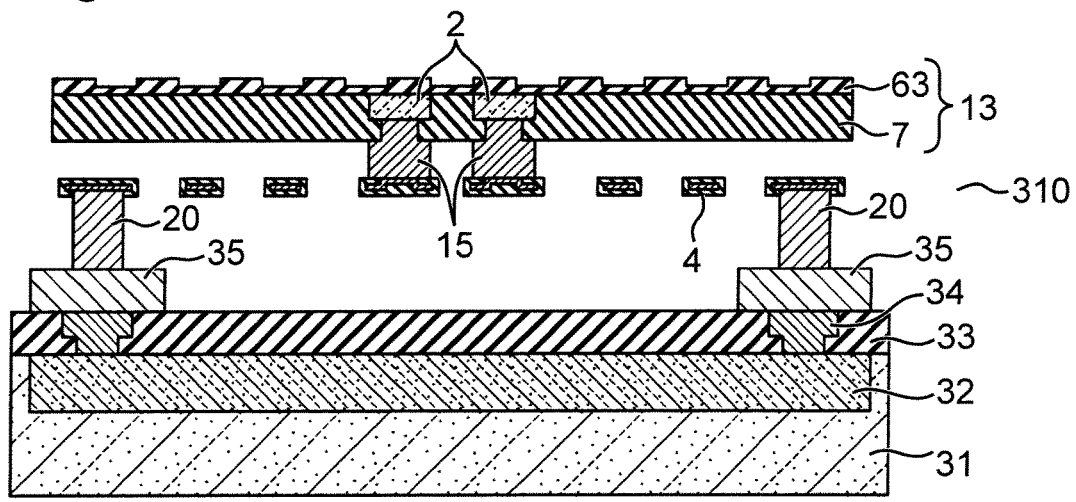
FIG. 14b is a cross-sectional view of another infrared imaging element according to the third embodiment of the present invention.
Figure 14C:
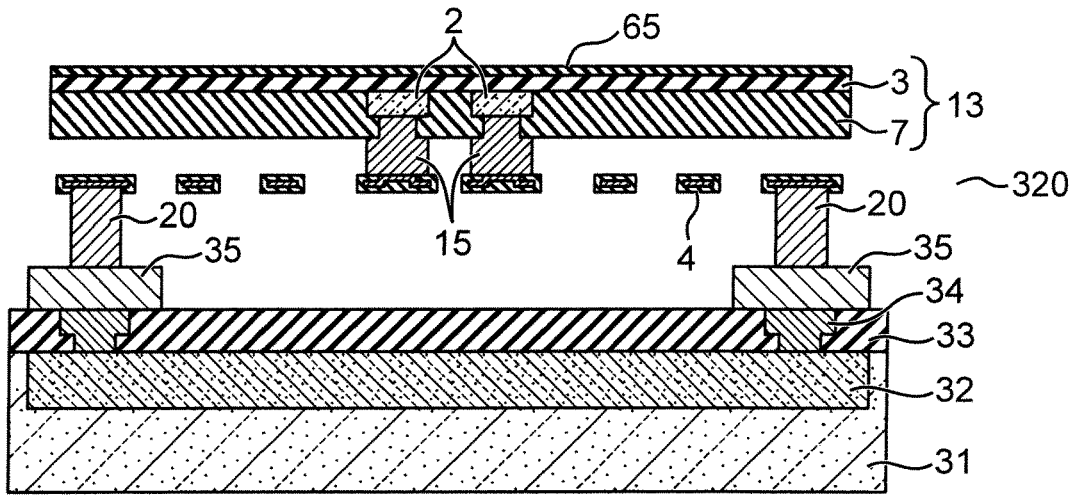
FIG. 14c is a cross-sectional view of another infrared imaging element according to the third embodiment of the present invention.

FIG. 14a is a cross-sectional view of an infrared imaging element according to the third embodiment of the present invention, which is generally denoted by 300. FIGS. 14b and 14c are cross-sectional views of other infrared imaging elements according to the third embodiment of the present invention, which are generally denoted by 310 and 320, respectively. In FIGS. 14a to 14c, the same reference numerals as in FIG. 1 indicate the same or corresponding portions.

In the infrared imaging elements 300, 310, and 320 according to the third embodiment of the present invention, the surface of the infrared detection part 13 opposite to the substrate 31 includes an electromagnetic wave absorbing structure.

The electromagnetic wave absorbing structure is selected from the group consisting of a protrusion 60 of a periodic structure formed on the infrared detection part 13, a BOX oxide film 63 of a texture structure provided on the surface of the infrared detection part 13, and an infrared absorbing film 65 provided on the infrared detection part 13.

Specifically, in the infrared imaging element 300 shown in FIG. 14a, the protrusions 60 are provided on the upper portion of the BOX oxide film 3 at regular intervals. The protrusions 60 include square prisms provided at regular intervals which are, for example, formed of silicon oxide.

In the infrared imaging element 310 shown in FIG. 14b, the upper portion of the BOX oxide film 63 is processed to form a texture structure (for example, a regular uneven structure).

Further, in the infrared imaging element 320 shown in FIG. 14c, the infrared absorbing film 65 is formed on the BOX oxide film 3. The infrared absorbing film 65 is made of, for example, an epoxy resin to which titanium oxide is added.

The wavelength of the electromagnetic wave to be absorbed is changed by changing the structure or material of the protrusion 60, the BOX oxide film 63 of the texture structure, or the infrared absorbing film 65 constituting the electromagnetic wave absorption structure. This makes it possible to detect not only infrared ray but also visible light, near infrared light, electromagnetic waves having a longer wavelength, and the like.

As described above, in the infrared imaging elements 300, 310, and 320 according to the third embodiment of the present invention, it is possible to change the absorption wavelength, narrow or broaden the band, and improve the absorptivity.

Fourth Embodiment

Figure 15:
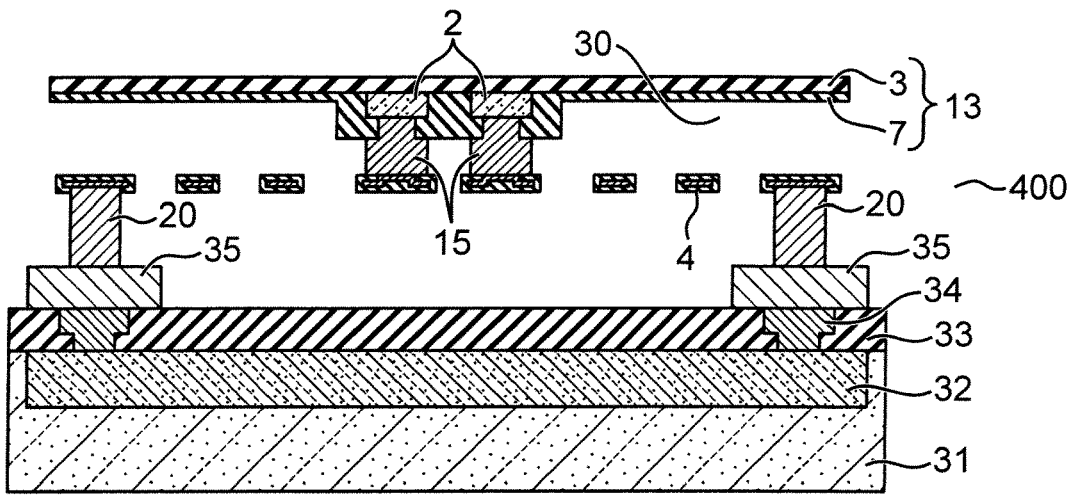
FIG. 15 is a cross-sectional view of an infrared imaging element according to a fourth embodiment of the present invention.

FIG. 15 is a cross-sectional view of an infrared imaging element according to the fourth embodiment of the present invention, which is generally denoted by 400. In FIG. 15, the same reference numerals as in FIG. 1 indicate the same or corresponding portions.

In the infrared imaging element 400, the infrared detection part 13 has a region 30 in which the film thickness in the direction perpendicular to the front surface of the substrate 31 is partially thin.

That is, in the infrared imaging element 400, the portion where the diode 2 is not disposed is partially removed in the infrared detection part 13, the infrared detection part removal region 30 is provided, and the infrared detection part 13 becomes thinner.

In general, the response speed of the infrared imaging element, that is, the thermal time constant can be represented by the ratio of the heat capacity of the infrared detection part 13 to the ease of heat dissipation (heat conductance) from the infrared detection part 13. That is, by reducing the heat capacity of the infrared detection part 13, it is also possible to detect high-speed changes in subject temperature.

In the infrared imaging element 400 according to the fourth embodiment of the present invention, the heat capacity of the infrared detection part 13 is reduced and the detection response speed is improved by providing the infrared detection part removal region 30 without reducing the light receiving area of the infrared detection part 13.

Figure 16:
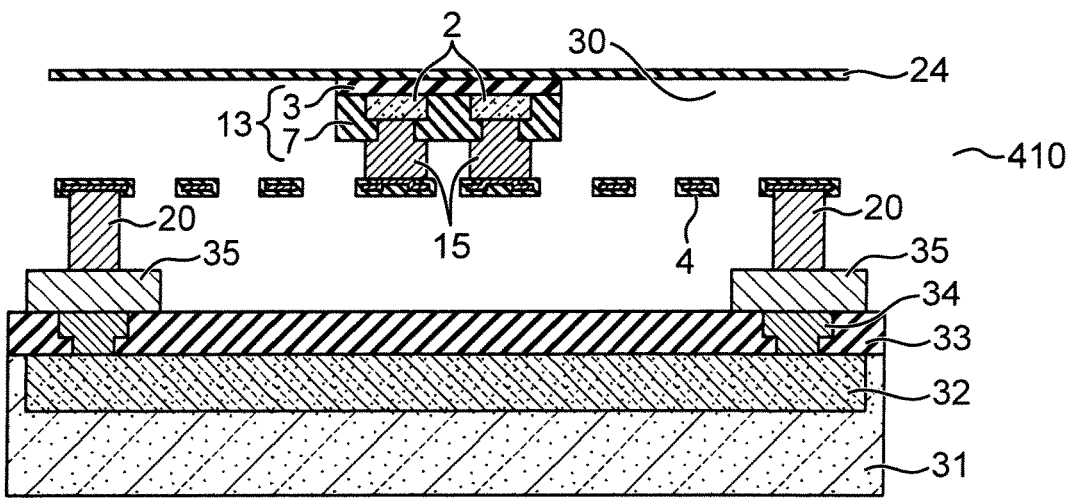
FIG. 16 is a cross-sectional view of another infrared imaging element according to the fourth embodiment of the present invention.

FIG. 16 is a cross-sectional view of another infrared imaging element according to the fourth embodiment of the present invention, which is generally denoted by 410. In FIG. 16, the same reference numerals as in FIG. 1 indicate the same or corresponding portions.

Although in the infrared imaging element 400, the portion in which the diode 2 is not disposed in the infrared detection part 13 is partially removed and thinned, in the infrared imaging element 410, all the portions in which the diodes 2 are not disposed are removed and a plate-shaped infrared absorbing umbrella 24 is separately provided. The infrared absorbing umbrella 24 is made of, for example, silicon nitride, and is formed so as to cover substantially the entire infrared imaging element 410.

The infrared imaging element 410 improves the detection response speed while maintaining the infrared sensitivity of the subject by reducing the heat capacity while maintaining the light receiving area of the infrared detection part.

Figure 17A:
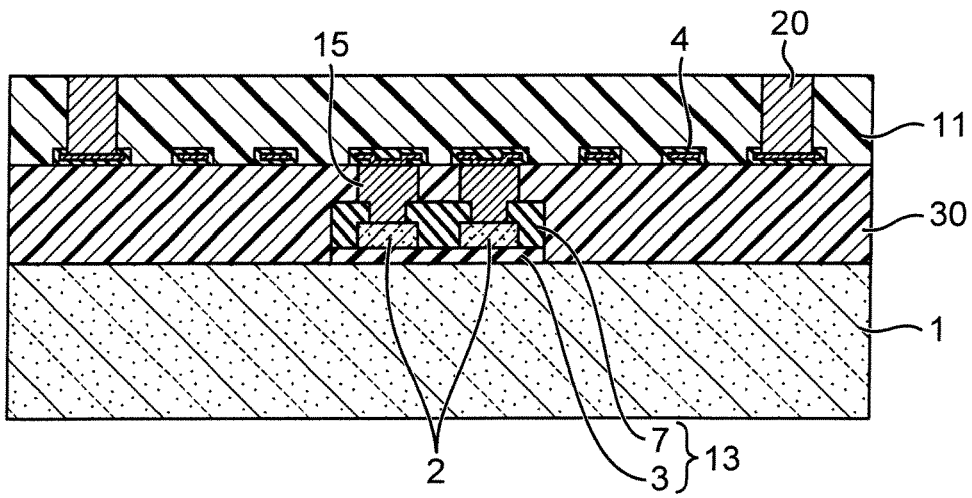
FIG. 17a is a cross-sectional view of a manufacturing process of the infrared imaging element according to the fourth embodiment of the present invention.
Figure 17B:
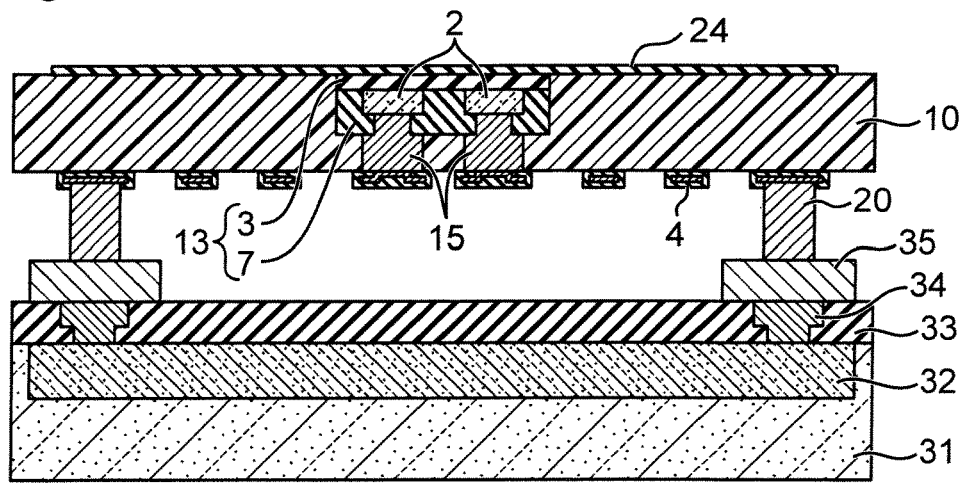
FIG. 17b is a cross-sectional view of the manufacturing process of the infrared imaging element according to the fourth embodiment of the present invention.

FIGS. 17a and 17b are cross-sectional views of manufacturing processes of the infrared imaging element 410. FIG. 17a is a process corresponding to the manufacturing process 7 (FIG. 10g) of the first embodiment, and the insulating film 7 and the BOX oxide film 3 constituting the infrared detection part 13 are removed except in the vicinity of diode 2.

The subsequent process of FIG. 17b is a process corresponding to the manufacturing process 9 (FIG. 10i) of the first embodiment, and after the first substrate 50 is attached on the second substrate 51, the infrared absorbing umbrella 24 is formed on the back surface of the first substrate 50. The sacrificial layer 10 is removed following this, and thereby the infrared imaging element 410 having a structure as shown in FIG. 16 is obtained.

Fifth Embodiment

Figure 18:
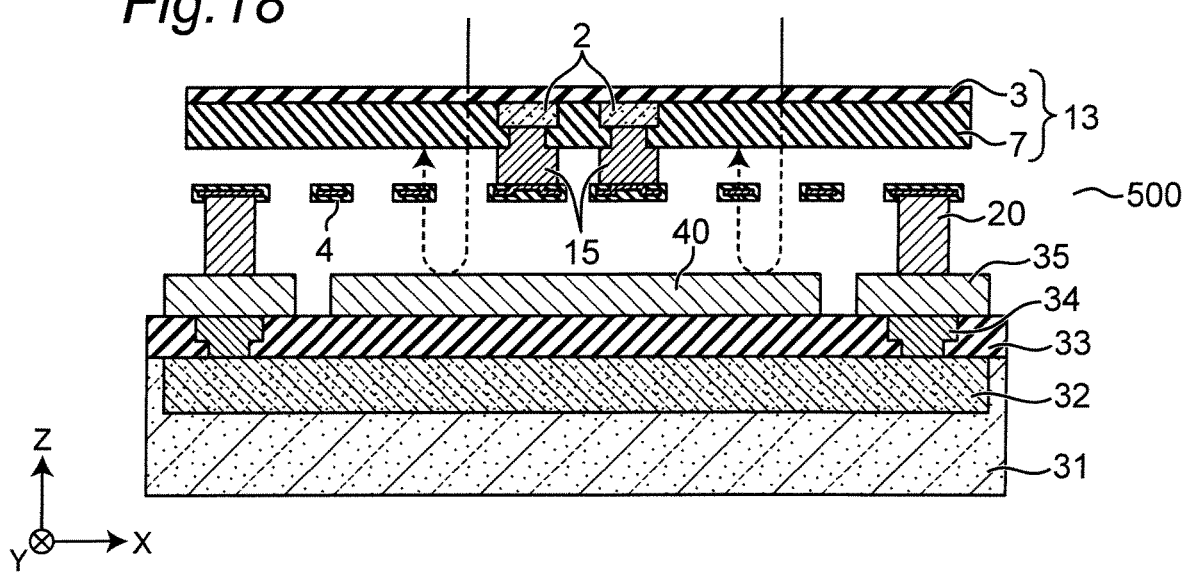
FIG. 18 is a cross-sectional view of an infrared imaging element according to a fifth embodiment of the present invention.

FIG. 18 is a cross-sectional view of an infrared imaging element according to the fifth embodiment of the present invention, which is generally denoted by 500. In FIG. 18, the same reference numerals as in FIG. 1 indicate the same or corresponding portions.

In the infrared imaging element 500 according to the fifth embodiment of the present invention, an infrared reflection film 40 is provided on the front surface of the substrate 31, specifically, on the insulating film 33 between the first substrate 50 and the second substrate 51.

As shown in FIG. 18, infrared rays incident from the Z-axis direction are incident on the BOX oxide film 3 for infrared absorption and absorbed thereby to be converted into thermal energy, but a part of incident light penetrates the BOX oxide film 3. In addition, a part of the incident light is incident from between the adjacent infrared detection parts 13. Such infrared rays cause a loss of infrared detection amount, which causes a decrease in detection sensitivity, and also enter the circuit part 32 to cause noise.

Therefore, in the infrared imaging element 500 according to the fifth embodiment, the infrared reflection film 40 is provided on the insulating film 33 of the second substrate 51 to reflect infrared rays having penetrated through the BOX oxide film 3 and having entered from the gap between the adjacent infrared detection parts 13 and allow the BOX oxide film 3 to re-absorb the infrared rays. Furthermore, the incidence of infrared rays on the circuit part 32 is prevented.

As described above, in the infrared imaging element 500 according to the fifth embodiment, the infrared reflection film 40 is provided to reflect and re-absorb the infrared rays, thereby improving the infrared detection sensitivity and simultaneously preventing the incidence of infrared rays on the circuit part 32 to achieve low noise.

The infrared reflection film 40 may be formed simultaneously with a metal layer 35 of the second substrate 51 or may be formed of another material in order to further improve the reflectance.

DESCRIPTION OF REFERENCE SYMBOLS

1 SUBSTRATE
2 DIODE
3 BOX OXIDE FILM
4 SUPPORTING LEG WIRING
7 INSULATING FILM
15 METAL WIRING
17 CONDUCTIVE FILM
18 INSULATING FILM
20 METAL LAYER
31 SUBSTRATE
32 CIRCUIT PART
33 INSULATING FILM
35 METAL LAYER
41 INFRARED DETECTION REGION
42 SUPPORTING LEG REGION
43 INFRARED ABSORPTION REGION
44 CIRCUIT REGION
45 WIRING REGION
50 FIRST SUBSTRATE
51 SECOND SUBSTRATE
100 INFRARED IMAGING ELEMENT

The invention claimed is:

1. An infrared imaging element, comprising:
a first substrate, comprising:
    a supporting leg wiring;
    a metal layer provided on the supporting leg wiring; and
    an infrared detection part held on the supporting leg wiring and provided with a diode electrically connected to the metal layer through the supporting leg wiring, and
a second substrate, comprising:
    a substrate having a front surface and a back surface and provided with a circuit part; and
    a metal layer formed on the front surface of the substrate,
    the first substrate being bonded to the second substrate so that the metal layer is connected to the metal layer, and
the infrared imaging element detecting a temperature change of the infrared detection part as a change of an electrical signal of the diode by the circuit part, wherein
the substrate, the supporting leg wiring, and the infrared detection part are stacked in a direction Z perpendicular to the front surface of the substrate at an interval therebetween,
the supporting leg wiring has one end connected to the metal layer which is formed on the metal layer provided on the surface of the substrate and to be a micro bump and another end connected to a metal wiring provided on the infrared detection part,
the metal wiring, which is not electrically connected to the supporting leg wiring, is also provided immediately above the supporting leg wiring connected to the metal layer, and a micro bump bonding strength reinforcing beam having the same structure as the infrared detecting part, formed of a BOX oxide film and a dielectric film separated from the infrared detecting part, and increasing the bonding strength of the micro bump.

2. The infrared imaging element according to claim 1, wherein a surface of the infrared detection part opposite to the substrate includes an electromagnetic wave absorbing structure.

3. The infrared imaging element according to claim 2, wherein the electromagnetic wave absorbing structure is selected from a group consisting of a protrusion having a periodic structure formed on the infrared detection part, a texture structure provided on the surface of the infrared detection part, and an infrared absorbing film provided on the infrared detection part.

4. The infrared imaging element according to claim 1, wherein the infrared detection part has a region in which a film thickness in a direction perpendicular to the front surface of the substrate is partially thin.

5. The infrared imaging element according to claim 1, wherein an infrared reflection film is provided on the front surface of the substrate.

6. An infrared imaging array comprising a plurality of the infrared imaging elements according to claim 1 arranged in an array.

7. The infrared imaging array according to claim 6, wherein the circuit part is provided across the adjacent infrared imaging elements.

8. A method for manufacturing an infrared imaging element, comprising:

a step of preparing a first substrate, the step including the steps of,
  preparing a SOI substrate having a BOX oxide film and a silicon layer on a substrate:
  processing the silicon layer to form a diode,
  after forming an insulating film on the BOX oxide film, opening the insulating film to expose the surface of the diode, and forming a first metal wiring connected to the diode and a second metal wiring on a part of the insulating film,
  forming a sacrificial layer on the BOX oxide film,
  forming a supporting leg wiring having an end connected to the first metal wiring on the sacrificial layer, and
  forming a first metal layer on the supporting leg wiring immediately above the second metal wiring formed on the insulating film, so that another end of the supporting leg wiring is connected to the first metal layer,
a step of preparing a second substrate, the step including the steps of,
  preparing a substrate having a front surface and a back surface,
  forming a circuit part on a front surface side of the substrate, and
  forming a second metal layer electrically connected to the circuit part,
a step of bonding the first metal layer and the second metal layer such that the front surfaces of the first substrate and the second substrate face each other;
a step of removing the substrate from a back surface side to expose the BOX oxide film;
a step of removing the sacrificial layer; and
a step of partially removing the BOX oxide film and the insulating film to form a micro bump bonding strength reinforcing beam, having the same structure as the infrared detecting part and separated from the infrared detecting part, on the second metal wiring above and connected to the first metal layer through the supporting leg wiring.

* * * * *